United States Patent
Hsu et al.

(10) Patent No.: US 7,071,032 B2
(45) Date of Patent: *Jul. 4, 2006

(54) MATERIAL TO IMPROVE IMAGE SENSOR YIELD DURING WAFER SAWING

(75) Inventors: Hung-Jen Hsu, Taoyuan (TW); Yu-Kung Hsiao, Taoyuan (TW); Chih-Kung Chang, Hsin-Chu (TW); Sheng-Liang Pan, Hsinchu (TW); Fu-Tien Weng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 262 days.

This patent is subject to a terminal disclaimer.

(21) Appl. No.: 10/431,275

(22) Filed: May 7, 2003

(65) Prior Publication Data

US 2004/0023470 A1 Feb. 5, 2004

Related U.S. Application Data

(63) Continuation-in-part of application No. 10/209,149, filed on Jul. 30, 2002, now Pat. No. 6,759,276.

(51) Int. Cl.
*H01L 21/44* (2006.01)
*H01L 21/48* (2006.01)
*H01L 21/50* (2006.01)

(52) U.S. Cl. ...................... 438/113; 438/460
(58) Field of Classification Search ................ 438/113, 438/14, 33, 68, 106, 110, 460, 464, 465
See application file for complete search history.

(56) References Cited

U.S. PATENT DOCUMENTS

| 5,516,728 | A | * | 5/1996 | Degani et al. | 438/465 |
| 5,641,714 | A | | 6/1997 | Yamanaka | 438/14 |
| 5,840,614 | A | | 11/1998 | Sim et al. | 438/464 |
| 5,981,361 | A | | 11/1999 | Yamada | 438/464 |
| 6,074,896 | A | | 6/2000 | Dando | 438/114 |
| 6,271,103 | B1 | | 8/2001 | Lee | 438/464 |
| 6,335,224 | B1 | * | 1/2002 | Peterson et al. | 438/114 |
| 6,507,082 | B1 | * | 1/2003 | Thomas | 257/414 |
| 6,759,276 | B1 | * | 7/2004 | Hsu et al. | 438/114 |

* cited by examiner

*Primary Examiner*—David Nhu

(57) ABSTRACT

A new method is provided of treating the wafer prior to the process of singulating the wafer into individual die. A first surface of the wafer over which CMOS image sensor devices have been created is coated with a layer of material that is non-soluble in water. The wafer is attached to a tape by bringing a second surface of the wafer in contact with the tape. The wafer is singulated by approaching the first surface of the wafer and by sawing first through the layer of material that has been coated over the first surface of the wafer and by then sawing through the wafer, stopping at the surface of the tape. A thorough water rinse is applied to the surface of the singulated wafer, followed by a wafer clean applying specific chemicals for this purpose. The singulated die is now removed from the tape and further processed by applying steps of die mount, wire bonding, surrounding the die in a mold compound and marking the package.

16 Claims, 3 Drawing Sheets

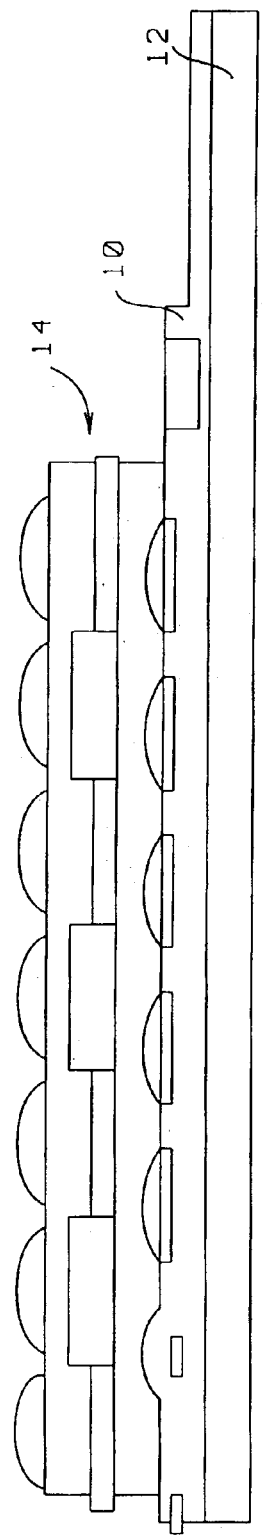
FIG. 1 - Prior Art
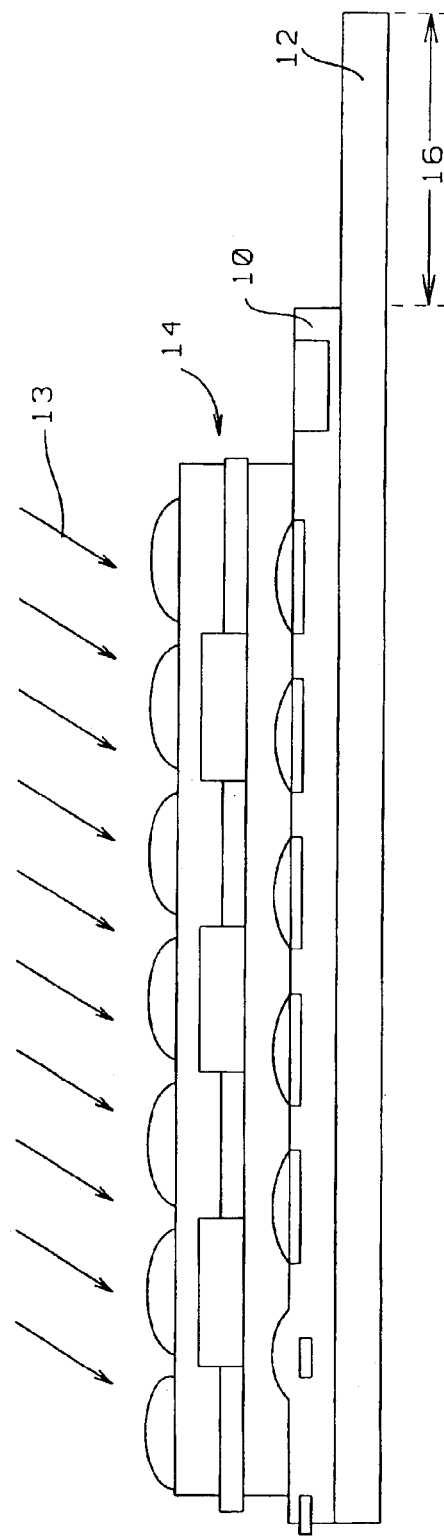
FIG. 2 - Prior Art

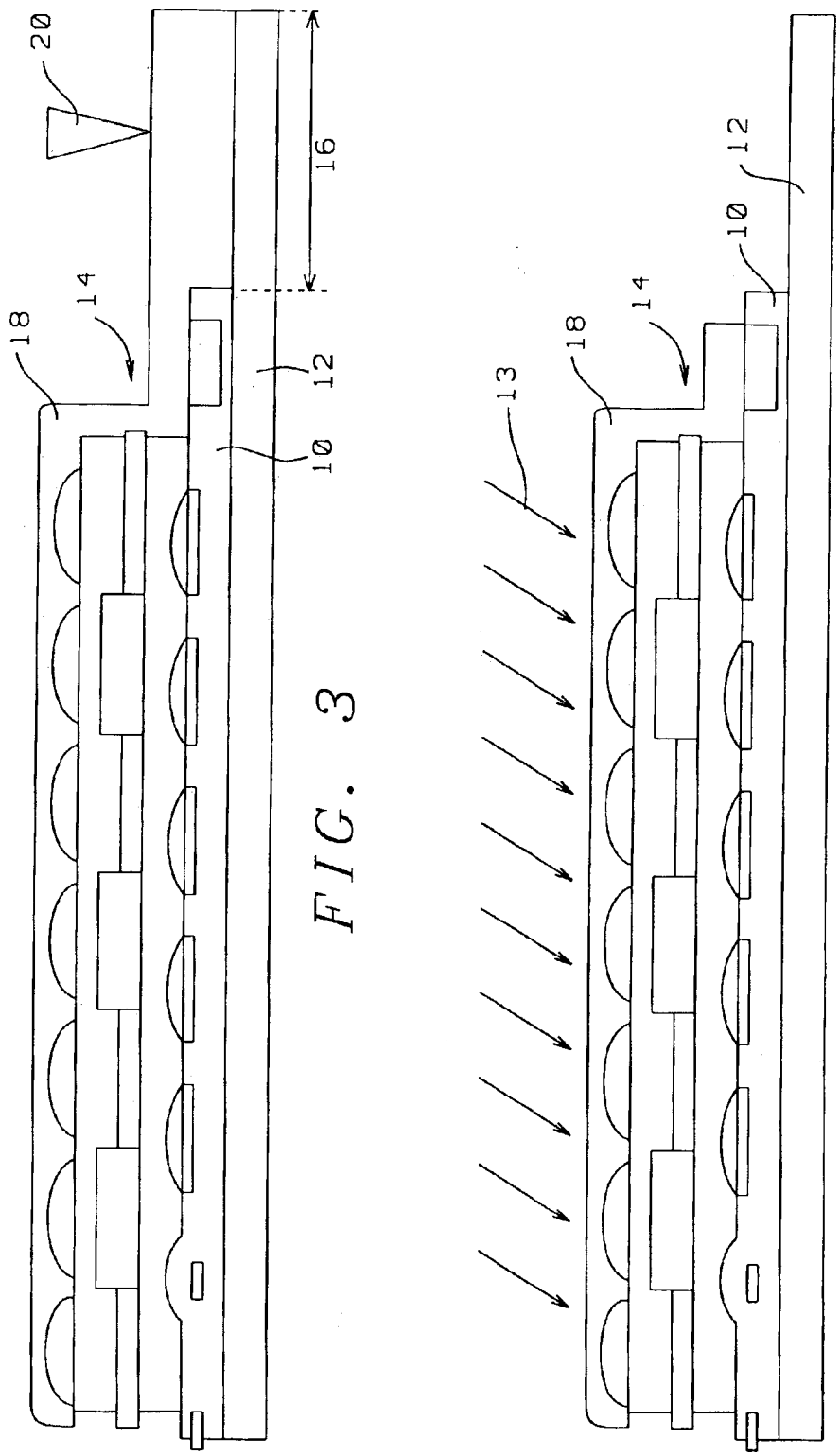

MATERIAL TO IMPROVE IMAGE SENSOR YIELD DURING WAFER SAWING

This application is a continuation-in-part of Ser. No. 10/209,419, filing date Jul. 30, 2002 now U.S. Pat. No. 6,759,276, assigned to common assignee.

BACKGROUND OF THE INVENTION

(1) Field of the Invention

The invention relates to the fabrication of integrated circuit devices, and more particularly, to a method of separating created image sensor devices in such a way that foreign particles created as byproducts of the sawing operation do not contribute to yield loss of the separated devices.

(2) Description of the Prior Art

The art of creating CMOS base image sensor devices is well known and is in addition highlighted in considerable detail in the below referenced and related US patents. Since this art does only indirectly apply to the invention and in view of the available literature on the subject of CMOS image sensor devices, no effort will be made at this time to provide further insight into the subject of creating CMOS image sensor devices.

CMOS image sensor devices are typically, like the majority of semiconductor devices that are created in a high volume and cost-effective manufacturing operation, created as multiple devices over the surface of one substrate. After the creation of these devices has been completed, the devices must be separated or singulated for further packaging of the devices. This process of singulation into individual chips is typically performed by sawing the wafer over the surface of which the devices have been created along scribe lines that have been provided over the surface of the substrate for this purpose. This process of sawing creates as a byproduct matter that is removed as a result of the sawing, which is essentially silicon based since it is the silicon substrate that is significantly affected by the sawing process.

The created byproduct of the sawing operation is not under control as far as distribution and scattering of this material is concerned. This leads to the creation of depositions of this byproduct not only where it is not desired but also where in addition it can have a severely negative impact on final product performance and acceptance. In short: the process of chip singulation by sawing of the wafer readily results in causing otherwise good chips to be contaminated with byproducts of the sawing process, which is a ready cause of final product failure. The invention addresses this concern and provides a method whereby a negative yield impact caused by byproducts of a singulation operation is eliminated.

U.S. Pat. No. 6,271,103 B1 (Lee) shows an UV Tape and die saw process for an image sensor.

U.S. Pat. No. 5,981,361 (Yamada) shows a dicing process.

U.S. Pat. No. 5,840,614 (Sim et al.) reveals a process using UV tape and lapping and sawing.

U.S. Pat. No. 5,641,714 (Yamanaka) discloses a process with tape.

U.S. Pat. No. 6,074,896 (Dando) shows a sawing process involving tape.

SUMMARY OF THE INVENTION

A principle objective of the invention is to provide a method of singulating image sensor devices, such as CMOS image sensor or CCD, from a wafer over the surface of which these devices have been created.

Another objective of the invention is to eliminate the process of die singulation as a device yield detractor.

Yet another objective of the invention is to provide a method of controlling byproducts that are created during the processes of singulating die from a wafer.

In accordance with the objectives of the invention a new method is provided of treating the wafer prior to the process of singulating the wafer into individual die. A first surface of the wafer over which CMOS image sensor devices have been created is coated with a layer of material that is non-soluble in water. The wafer is attached to a tape by bringing a second surface of the wafer in contact with the tape. The wafer is singulated by approaching the first surface of the wafer and by sawing first through the layer of material that has been coated over the first surface of the wafer and by then sawing through the wafer, stopping at the surface of the tape. A thorough water rinse is applied to the surface of the singulated wafer, followed by a wafer clean applying specific chemicals for this purpose. The singulated die is now removed from the tape and further processed by applying steps of die mount, wire bonding, surrounding the die in a mold compound and marking the package.

BRIEF DESCRIPTION OF THE DRAWINGS

FIGS. 1 and 2 show conventional processes of singulating a wafer over the surface of which CMOS image sensor devices have been created.

FIG. 3 shows a cross section of a substrate over the surface of which CMOS image sensor devices have been created, a layer of material, which is not soluble in water, has been deposited over the active surface of the substrate.

FIG. 4 shows a cross section after the wafer shown in cross section in FIG. 3 has been singulated down to the surface of the blue tape.

DESCRIPTION OF THE PREFERRED EMBODIMENTS

Figure 5:
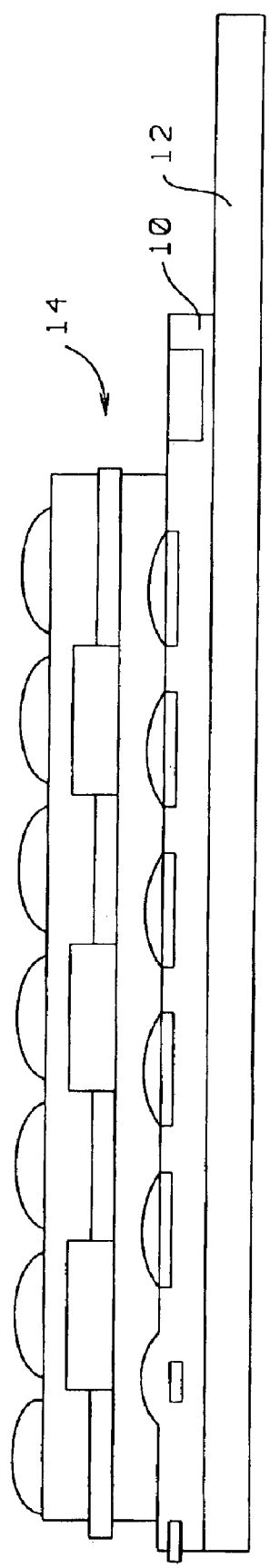
FIG. 5 shows a cross section after the layer of material, which is not soluble in water, has been removed from the active surface of the substrate.

Conventional processing steps of creating CMOS image sensor devices typically have a yield of between about 70 and 80%. CMOS image sensor devices are, due to the nature and the therefrom following construction of the devices, highly sensitive to any foreign particles or contaminants that may come in contact with or accumulate over exposed surfaces of the devices before these devices are finally packaged and enclosed.

In creating CMOS image sensor devices, the step of singulating the created devices into individual chips is a step that significantly and detrimentally introduces a large amount of foreign particles into the environment that surrounds the devices during and immediately after these devices are singulated. This is due to the fact that singulation is performed by sawing the wafer over the surface of which the CMOS image devices have been created, creating as a byproduct particles of mostly silicon derived from the silicon substrate. The process of singulating the wafer into individual CMOS image sensor devices has been identified as causing a yield loss of between about 15% and 20%.

The current methods of singulating a wafer over the surface of which CMOS image devices have been created comprises the steps of:
Applying a backside blue tape to the wafer
Sawing the wafer into individual die, leaving the sawed die attached to the tape Applying a water rinse to the surface of the sawed die
Removing the sawed die from the tape, and
Packaging the singulated die.

This prior art process has been further highlighted with the cross sections shown in FIGS. 1 and 2, wherein specifically are highlighted:

10, the substrate over the surface of which CMOS image sensor devices have been created
12, the blue tape that is attached to a second surface of substrate 10
14, the multiple CMOS image sensor devices that have been created over a first or active surface of substrate 10, and
16, the saw path that will be used for the singulation of the wafer into individual die.

FIG. 2 shows a prior art cross section after the process of sawing the wafer 10 has been completed in accordance with the saw path 16, FIG. 1. The singulated die 14 is as yet attached to the blue tape 12.

At this time, that is after the cross section of FIG. 2 has been obtained, a water rinse 13 is applied to the surface of the singulated die after which the die 14 is removed from tape 12 for further packaging.

The conventional method of die singulation as highlighted above is changed as follows:
Applying a backside blue tape to the wafer
Next and most significantly to the invention, applying a protective layer of material that is not soluble in water over the active or first surface of the wafer, that is the surface over which CMOS image sensor devices have been created
Sawing the wafer into individual die by, while approaching the wafer from the first or active side of the wafer, that is the side over which the protective layer has been applied:
1. sawing through the protective layer applied over the active or first surface of the wafer, and then
2. sawing through the silicon substrate, leaving the sawed die attached to the tape
Applying a water rinse to the surface of the sawed die
Removing the protective layer from the active surface of the wafer by cleaning the active surface of the wafer with a special chemical that removes the non-water soluble protective layer
Removing the sawed die from the tape, and
Packaging the singulated die.

FIGS. 3 and 4 further highlight these processing steps, whereby specifically is shown in the cross section of FIG. 3 how a layer 18 of material that is not soluble in water is applied over the surface of the created CMOS image sensor devices 14, this after first the wafer has been attached to the blue tape 12. The die saw 20 is positioned above the saw path 16 for application to the surface of substrate 10 with the objective of cutting the wafer along the saw path 16. The result of this process of sawing substrate 10 is shown in the cross section of FIG. 4, where the protective layer 18 has first been removed in accordance with the saw path 16 after which the silicon of substrate 10 has been removed. Layer 18 has, during the processes of sawing the substrate 10, remained in place as a protective layer for and overlying the CMOS image devices 14. No foreign particles can therefore be deposited over the surface of these CMOS image devices 14.

After the above highlighted sawing of protective layer 18 and wafer 10 has been completed, a water rinse 13, FIG. 4, is applied to the active surface of the wafer 10. The protective layer 18 is then removed from over the active surface of wafer 19.

The removal of the protective layer 18 results in the cross section that is shown in FIG. 5. From the sequence of cross section that have been shown in FIGS. 3 through 5, it is clear that the special layer 18, FIGS. 3 and 4, has protected the surface of the layer 14 of CMOS image sensor devices during the step of singulating the wafer into individual die.

After the layer 18 has been removed from above the active surface of the wafer, the singulated die 14 is removed from the tape 12 (not shown) and is now ready for further packaging operations such as die mount, wire bonding, surrounding the die in a mold compound and marking the package.

To summarize the invention:
A new sequence of steps is provided for the singulation of a wafer over the surface of which multiple CMOS image sensor devices have been created
The new sequence of processing steps that is provided by the invention comprises
1. first applying a special, protective layer over the first, active surface of the wafer, this layer may not be water soluble
2. applying a backside blue tape to a second surface of the wafer
3. sawing the wafer by first sawing through the protective layer and then sawing through the silicon of the wafer
4. applying a water rinse to the active surface of the sawed wafer
5. applying a wafer surface clean using a chemical cleaning agent that removes the special layer from the first surface of the wafer, and
6. removing the singulated die from the blue tape The singulated CMOS image sensor device die are then further packaged following conventional methods of device packaging.

While the examples that have been shown in the cross sections of FIGS. 3 through 5 concentrate on the singulation of CMOS image sensor devices, it must be emphasized that the method of the invention of protecting the active surface of a substrate before this substrate is singulated is equally applicable for substrates over the surface of which semiconductor devices other than CMOS image sensor devices have been created. The concern of not creating a yield detractor due to the disbursement and accumulation of foreign matter over the surface of created semiconductor devices is universal and is not limited to where the created semiconductor devices are CMOS image sensor devices, even if this latter category of devices is most sensitive to the impact of foreign particles that are deposited over the surface thereof.

It must further be emphasized, as an extension of the invention, that the invention is not limited to removing the protective layer before die mounting but can be further extended to where the protective layer is removed after die mounting.

To further highlight this extension, the steps of the invention are detailed below for the application where the removal of the special layer from die is performed after die mounting, as follows:
1. first applying a special, protective layer over the first, active surface of the wafer, this layer may not be water soluble
2. applying a backside blue tape to a second surface of the wafer
3. sawing the wafer by first sawing through the protective layer and then sawing through the silicon of the wafer
4. applying a water rinse to the active surface of the sawed wafer
5. removing the singulated die from the blue tape
6. mounting the singulated die over a supporting surface, and 7. applying a wafer surface clean to the mounted die using a chemical cleaning agent that removes the special layer from the surface of die.

The above referred to supporting surface can be a semiconductor substrate, a printed circuit board, a flex circuit, a metallized substrate, a glass substrate and a semiconductor device mounting support.

The above referred to semiconductor substrate can be a silicon semiconductor substrate, a ceramic substrate, a glass substrate, a gallium arsenide substrate, a silicon substrate comprising a single layer of material, such as a silicon wafer or comprising silicon on insulator (SOI) technology and silicon on sapphire (SOS) technology, a doped or undoped semiconductor, epitaxial layers of silicon supported by a base semiconductor, a sapphire substrate or a substrate used for flat panel displays.

The above referred protective layer comprising a non-water soluble material can be a negative photoresist without photo-sensitive components or a positive photoresist.

The above referred to chemical cleaning agent that removes the non-water soluble material layer from die, which can as stated be applied either before or after die mount, comprises poly-ethylene, polymethyl methacrylate (PPMA), poly glycidol methacrylate (PGMA), propylene glycol monoethyl ether acetate, ethylene glycol monoethyl ether acetate, cyclized 1,4-cis polyisoprene, novolak resin, methacrylate resin, cresol formaldehyde, ethyl lactate or ethyl 3-ethoxypropionate.

Where previously the invention has been highlighted as typically being applied to the creation of CMOS image sensors, the invention is not limited to CMOS image sensors but can preferably be extended to the creation of Charge Coupled Devices (CCD).

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for singulation of semiconductor devices from a semiconductor substrate, comprising the steps of:
    providing a semiconductor substrate having a first and a second surface, said substrate having semiconductor devices on the first surface;
    depositing a protective layer on the first surface over said semiconductor devices;
    singulating said semiconductor devices by sawing the semiconductor substrate through the protective layer; and
    removing said protective layer from said singulated semiconductor devices.

2. The method of claim 1, wherein said semiconductor devices comprising CMOS image sensor devices.

3. The method of claim 1, wherein said protective layer is a non-water soluble material.

4. The method of claim 1, wherein said semiconductor devices comprising charge couple devices.

5. The method of claim 3, wherein said non-water soluble material is a negative photoresist without photo-sensitive components, or a positive photoresist.

6. The method of claim 3, wherein said non-water soluble material is one of poly-ethylene, polymethyl methacrylate (PMMA), poly glycidol methacrylate (PGMA), propylene glycol monoethyl ether acetate, ethylene glycol monoethyl ether acetate, cyclized 1,4-cis polyisoprene, novolak resin, methacrylate resin, cresol formaldehyde, ethyl lactate, or ethyl 3-ethoxypropionate.

7. A method for singulation of semiconductor devices from a semiconductor substrate, comprising the steps of:
    providing a semiconductor substrate having a first and a second surface, said substrate having semiconductor devices on the first surface;
    depositing a protective layer on the first surface over said semiconductor devices;
    singulating said semiconductor devices by sawing the semiconductor substrate through the protective layer;
    mounting one of said singulated semiconductor devices over a supporting surface; and
    removing said protective layer from said mounted singulated semiconductor device.

8. The method of claim 7, wherein said semiconductor devices comprising CMOS image sensor devices.

9. The method of claim 7, wherein said semiconductor devices comprising CCD devices.

10. The method of claim 7, wherein said protective layer is a non-water soluble material.

11. The method of claim 10, wherein said non-water soluble material is one of poly-ethylene, polymethyl methacrylate (PMMA), poly glycidol methacrylate (PGMA), propylene glycol monoethyl ether acetate, ethylene glycol monoethyl ether acetate, cyclized 1,4-cis polyisoprene, novolak resin, methacrylate resin, cresol formaldehyde, ethyl lactate, or ethyl 3-ethoxypropionate.

12. The method of claim 7, wherein the supporting surface is one of a semiconductor substrate, a printed circuit board, a flex circuit, a metallized substrate, a glass substrate or a semiconductor device mounting support.

13. The method of claim 12, wherein the semiconductor substrate is a silicon semiconductor substrate, a ceramic substrate, a glass substrate, a gallium arsenide substrate, a doped or undoped semiconductor, epitaxial layers of silicon supported by a base semiconductor, a sapphire substrate, or a substrate used for flat panel displays.

14. The method of claim 1, further comprising a step of attaching the second surface of the semiconductor substrate to a tape after the protective layer is deposited on the first surface, wherein the step of sawing the semiconductor substrate through the protective layer stops at the surface of the tape.

15. The method of claim 7, further comprising a step of attaching the second surface of the semiconductor substrate to a tape after the protective layer is deposited on the first surface, wherein the step of sawing the semiconductor substrate through the protective layer stops at the surface of the tape.

16. The method of claim 13, wherein the silicon semiconductor substrate is one of a silicon wafer, a silicon on insulator substrate or a silicon on sapphire substrate.

* * * * *